(12) United States Patent
Sakurai et al.

(10) Patent No.: US 8,670,280 B2
(45) Date of Patent: Mar. 11, 2014

(54) CHARGE PUMP CIRCUIT, NONVOLATILE MEMORY, DATA PROCESSING APPARATUS, AND MICROCOMPUTER APPLICATION SYSTEM

(75) Inventors: Ryotaro Sakurai, Kanagawa (JP); Hideo Kasai, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 198 days.

(21) Appl. No.: 13/181,804

(22) Filed: Jul. 13, 2011

(65) Prior Publication Data

US 2012/0014193 A1 Jan. 19, 2012

(30) Foreign Application Priority Data

Jul. 14, 2010 (JP) .................................. 2010-159489

(51) Int. Cl.
*G11C 7/00* (2006.01)
*G05F 3/02* (2006.01)

(52) U.S. Cl.
USPC ...................................... 365/189.11; 327/536

(58) Field of Classification Search
USPC ....................................... 327/536; 365/189.11
See application file for complete search history.

(56) References Cited

U.S. PATENT DOCUMENTS

| | | | |
|---|---|---|---|
| 6,608,782 B2 * | 8/2003 | Hirano | 365/189.09 |
| 7,256,641 B2 * | 8/2007 | Namekawa et al. | 327/536 |
| 7,724,070 B2 * | 5/2010 | Fukami | 327/536 |

FOREIGN PATENT DOCUMENTS

| | | |
|---|---|---|
| JP | 2001-043690 A | 2/2001 |
| JP | 2001-85633 A | 3/2001 |
| JP | 2002-261239 A | 9/2002 |

OTHER PUBLICATIONS

Office Action dated Dec. 5, 2013, in Japanese Patent Application No. 2010-159489.

* cited by examiner

*Primary Examiner* — Hoai V Ho
*Assistant Examiner* — Tri Hoang
(74) *Attorney, Agent, or Firm* — Miles & Stockbridge P.C.

(57) ABSTRACT

Improvement technology of a charge pump circuit is provided for avoiding device destruction due to electrification of an intermediate node of plural capacitors coupled in series to form one step-up capacitor, and avoiding reduction of pump efficiency due to leakage current which flows through a leakage path of the intermediate node concerned. A charge pump circuit includes a step-up capacitor configured by a first capacitance and a second capacitance coupled in series, a capacitance driver, and a protection circuit. The protection circuit is set at a conductive state and discharges a stored charge at the series coupling node of the first capacitance and the second capacitance, when the step-up voltage is not generated, and the protection circuit is maintained in a nonconductive state, when the step-up voltage is generated. Accordingly, relaxation of the withstand voltage of the step-up capacitor is achieved, and reduction of the pump efficiency is avoided.

11 Claims, 13 Drawing Sheets

CHARGE PUMP CIRCUIT, NONVOLATILE MEMORY, DATA PROCESSING APPARATUS, AND MICROCOMPUTER APPLICATION SYSTEM

CROSS-REFERENCE TO RELATED APPLICATIONS

The disclosure of Japanese Patent Application No. 2010-159489 filed on Jul. 14, 2010 including the specification, drawings and abstract is incorporated herein by reference in its entirety.

BACKGROUND

The present invention relates to improvement technology of a charge pump circuit, and to technology which is effective when applied to a power supply circuit of a nonvolatile memory, for example.

A semiconductor device using a nonvolatile memory is configured by a nonvolatile memory, its peripheral circuit, and others. A nonvolatile memory is provided with a floating gate, a control gate, etc. which are stacked over a substrate. In a semiconductor device using such a nonvolatile memory, various kinds of power supply for operating the nonvolatile memory and its peripheral circuit are generated by an internal power supply voltage generating circuit. Especially, a charge pump circuit is used for a step-up of high voltage.

A charge pump circuit includes a positive voltage step-up circuit and a negative voltage step-up circuit, as described in Patent Document 1 (paragraphs 0038-0052). According to Patent Document 1, capacitor structure of a charge pump circuit of a flash memory is configured by a capacitor C1 formed by an insulating film sandwiched between a first gate FG in the same layer as a floating gate and a second gate SG in the same layer as a control gate of a nonvolatile memory cell, and a capacitor C2 formed by an insulating film sandwiched between the first gate FG and a well region nwell. The second gate SG and the well region nwell are formed at the same potential, and the capacitor C1 and the capacitor C2 are coupled in parallel. The capacitor C1 and the capacitor C2 are stacked in a tandem structure.

(Patent Document Japanese Patent Laid-open No. 2001-085633

SUMMARY

In such a charge pump circuit, an absolute value of voltage becomes larger at a step-up stage which is located nearer an output terminal of the charge pump circuit; therefore, it is important that voltage applied to a terminal of a capacitance (a "step-up capacitor") in the step-up stage concerned is set not to exceed the destruction withstand voltage of the step-up capacitor concerned. As a measure of relaxing the withstand voltage, it is possible to form one step-up capacitor with two capacitors coupled in series, thereby suppressing an absolute value of voltage applied to per capacitor. The inventors of the present application examined such a relaxation measure for the withstand voltage and found out the following problems.

That is, when there is no suitable leakage path for a series coupling node (it is called an "intermediate node") of the two capacitors coupled in series to form one step-up capacitor, undesirable electrification may take place to the intermediate node, inducing a possibility of device destruction due to the electrification. When there is a leakage path for the intermediate node of the two capacitors coupled in series to form one step-up capacitor, there is a possibility that pump efficiency of the charge pump circuit may fall due to leakage current which flows through the leakage path concerned.

The present invention has been made in view of the above circumstances and provides technology in which it is possible to avoid device destruction due to electrification of the intermediate node of plural capacitors coupled in series with each other to form one step-up capacitor, and in which it is possible to avoid falling of the pump efficiency due to the leakage current which flows through a leakage path of the intermediate node concerned.

The above and other purposes and new features will become clear from description of the specification and the accompanying drawings of the present invention.

The following explains briefly an outline of typical inventions to be disclosed by the present application.

That is, a charge pump circuit is configured by a step-up capacitor including a first capacitance and a second capacitance coupled in series with each other, a capacitance driver capable of generating step-up voltage by driving the step-up capacity; and a protection circuit coupled to a series coupling node of the first capacitance and the second capacitance. The protection circuit is set in a conductive state and discharges a stored charge at the series coupling node of the first capacitance and the second capacitance, when the step-up voltage is not generated, and the protection circuit is maintained in a non-conductive state, when the step-up voltage is generated.

The following explains briefly an effect obtained by the typical inventions to be disclosed in the present application.

That is, it is possible to provide technology for the purpose of avoiding device destruction due to electrification of the intermediate node of plural capacitors coupled in series with each other to form one step-up capacitor, and avoiding falling of the pump efficiency due to the leakage current which flows through a leakage path of the intermediate node concerned.

BRIEF DESCRIPTION OF THE DRAWINGS

The present invention will become fully understood from the detailed description given hereinafter and the accompanying drawings, wherein.

DETAILED DESCRIPTION

Figure 1:
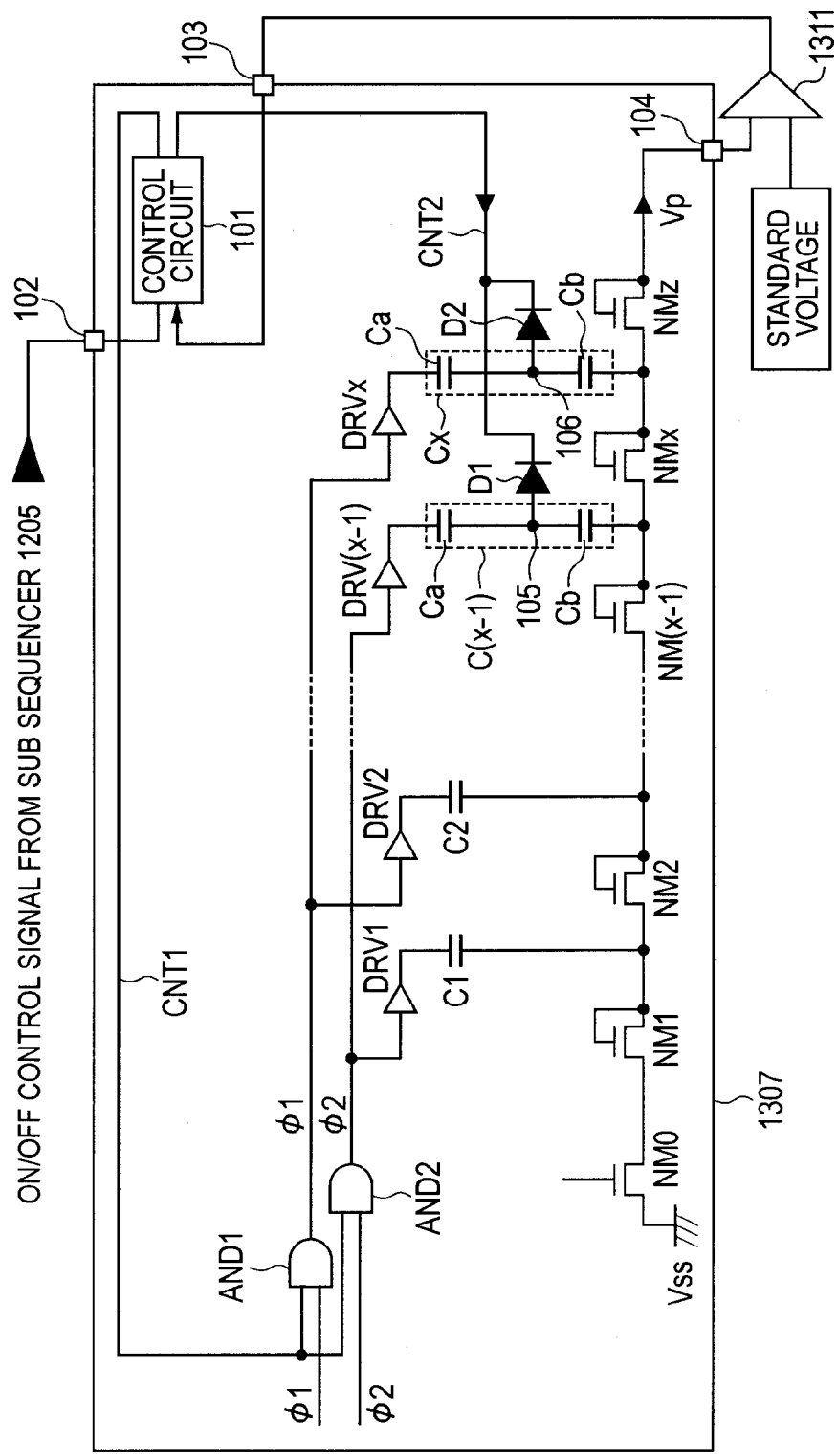
FIG. 1 is a circuit diagram illustrating an exemplified configuration of a charge pump circuit according to the present invention.

Hereinafter, with reference to the accompanying drawings, the embodiments of the present invention are explained in detail.

1. Outline of Embodiment

First, an outline of a typical embodiment of the invention disclosed in the present application is explained. A numerical symbol of the drawing referred to in parentheses in the outline explanation about the typical embodiment only illustrates what is included in the concept of the component to which the numerical symbol is attached.

(1) A charge pump circuit (1307) according to a typical embodiment of the present invention includes a step-up capacitor (C(x−1), Cx) including a first capacitance (Ca) and a second capacitance (Cb) coupled in series with each other, a capacitance driver (DRV(x−1), DRVx) for generating step-up voltage by driving the step-up capacitor, and a protection circuit (D1, D2) coupled to a series coupling node (105,106) of the first capacitance and the second capacitance. The protection circuit is set in a conductive state and discharges a stored charge at the series coupling node of the first capacitance and the second capacitance, when the step-up voltage is not generated, and the protection circuit is maintained in a non-conductive state, when the step-up voltage is generated.

According to the configuration, it is possible to suppress low an absolute value of voltage applied to per capacitor, by forming one step-up capacitor with the first capacitance and the second capacitance coupled in series with each other. In the charge pump circuit, an absolute value of voltage becomes larger at a step-up stage which is located nearer an output terminal of the charge pump circuit. However, as described above, it is possible to suppress low an absolute value of voltage applied to per capacitor, by forming one step-up capacitor with the first capacitance and the second capacitance coupled in series with each other. Accordingly, it is possible to improve the relaxation of the withstand voltage of the step-up capacitor. In such a relaxation measure for the withstand voltage of a step-up capacitor, the protection circuit is set in a conductive state when the step-up voltage is not generated, and a stored charge of the series coupling node of the first capacitance and the second capacitance is discharged. Therefore, a leakage path is formed by the protection circuit. Accordingly, it is possible to avoid device destruction resulting from electrification of the series coupling node of the first capacitance and the second capacitance. Furthermore, the protection circuit is maintained in a non-conductive state when the step-up voltage is generated. Therefore, it is possible to prevent a leakage current which flows through the leakage path of the series coupling node of the first capacitance and the second capacitance; accordingly, it is possible to avoid falling of the pump efficiency.

(2) In Paragraph (1), the protection circuit can be configured by including a diode (D1, D2) coupled to the series coupling node of the first capacitance and the second capacitance. Accordingly, the protection circuit can be formed easily.

(3) In Paragraph (2), the charge pump circuit is provided with a control circuit (101) which can control potential of a cathode of the diode. By controlling the potential of the cathode of the diode by use of the control circuit, it is possible to realize the function of the protection circuit easily.

(4) In Paragraph (3), the control circuit can be configured so as to control the cathode of the diode to a low level when the step-up voltage is not generated, and to control the cathode of the diode to a high level when the step-up voltage is generated. By such control performed in the control circuit, the diode is set in a conductive state when the step-up voltage is not generated; accordingly the diode discharges a stored charge of the series coupling node of the first capacitance and the second capacitance. The diode is maintained in a non-conductive state, when the step-up voltage is generated.

(5) In Paragraph (4), the diode is a pn junction diode in which a p-type diffusion layer (p+) and an n-type diffusion layers (n+) in an n-well region (nwell) are joined. By coupling an anode of the pn junction diode to the series coupling node of the first capacitance and the second capacitance, the function of the diode described above can be exhibited.

(6) In Paragraph (1), the protection circuit can employ devices other than the diode. For example, the protection circuit can be configured by including a switch by means of an MOS transistor (1001, 1002) coupled to the series coupling node of the first capacitance and the second capacitance.

(7) In Paragraph (6), the charge pump circuit can be provided with a control circuit (101) which can control operation of the switch by means of the MOS transistor.

(8) In Paragraph (7), the control circuit controls the switch to a conductive state when the step-up voltage is not generated, and controls the switch to a non-conductive state when the step-up voltage is generated. By such control, the switch is set in a conductive state when the step-up voltage is not generated and the switch discharges a stored charge of the series coupling node of the first capacitance and the second capacitance. The switch is maintained in a non-conductive state, when the step-up voltage is generated.

(9) In Paragraph (5), various configurations can be considered as to the first capacitance and the second capacitance coupled in series each other. For example, the step-up capacitor including the first capacitance and the second capacitance coupled in series each other can adopt lamination of a first polysilicon layer (PolySi1) and a second polysilicon layer (PolySi2) with an insulating film interposed therebetween, over a well region (pwell).

(10) In Paragraph (5), the first capacitance and the second capacitance can adopt lamination of polysilicon layers (PolySi) with an interposing insulating film, over a well region (pwell). Since the second capacitance is laminated over the first capacitance, the first capacitance and the second capacitance can be formed in area occupied by one piece of capacitance.

(11) In Paragraph (5), the first capacitance and the second capacitance can adopt lamination of an upper metal layer (501, 503) and a lower metal layer (502, 504) with an insulating film interposed therebetween.

(12) A nonvolatile memory (1103) can be configured by a charge pump circuit (1307), a memory array (1208) in which a nonvolatile memory cells are arranged, and a circuit (1209, 1210) which performs a read/write to the memory array using a step-up voltage generated by the charge pump circuit. Improvement in the reliability of the nonvolatile memory can be achieved by adopting the charge pump circuit with the working-effects as described above.

(13) A data processing apparatus can be configured by including the nonvolatile memory (1103) and a CPU (1107) which can access the nonvolatile memory. Improvement in the reliability of the data processing apparatus can be achieved by adopting the nonvolatile memory.

(14) In a microcomputer application system (1401, 1501, 1601) mounting a microcomputer which executes a predetermined control program, the data processing apparatus according to Paragraph (13) can be adopted as the microcomputer.

2. Details of Embodiment

The embodiments are explained in more detail.

Embodiment 1

Figure 11:
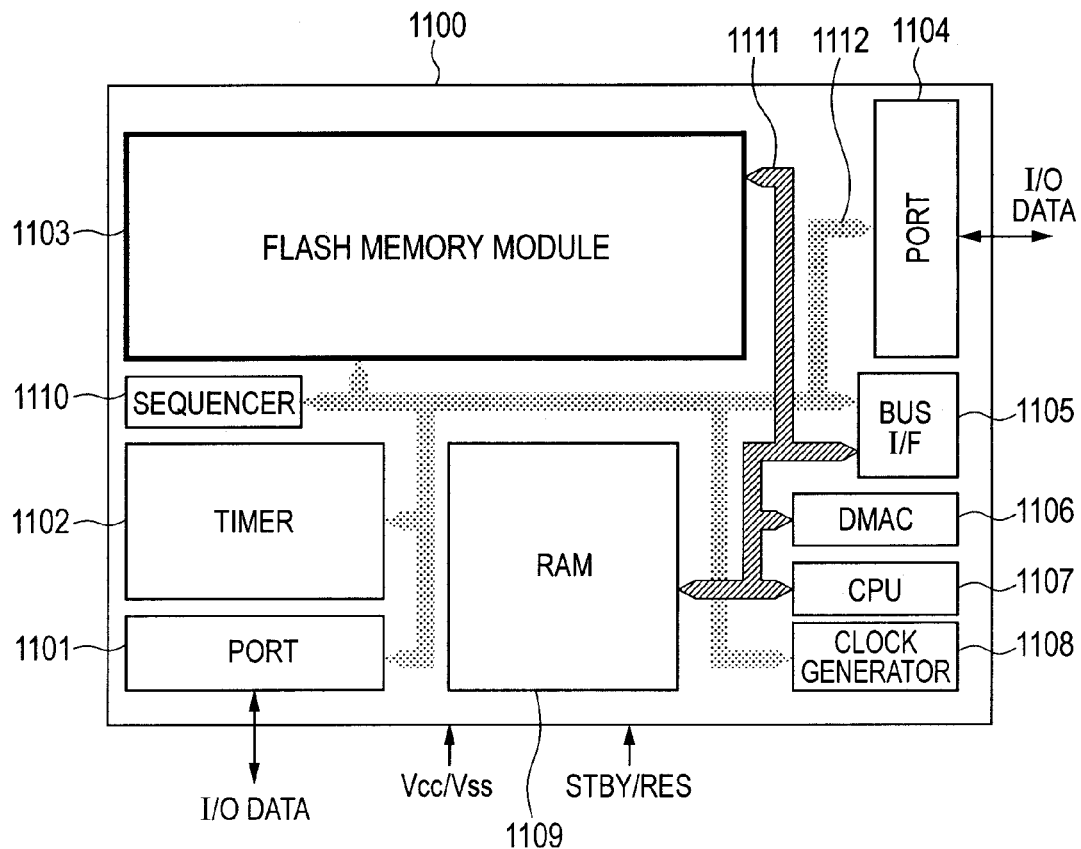
FIG. 11 is a block diagram illustrating an exemplified configuration of a microcomputer as an example of a data processing apparatus according to the present invention.

FIG. 11 illustrates a microcomputer as an example of a data processing apparatus according to the present invention.

A microcomputer 1100 illustrated in FIG. 11 includes ports 1101 and 1104, a timer 1102, a flash memory module 1103, a bus interface (bus IF) 1105, and a DMAC (Direct Memory Access Controller) 1106. The microcomputer 1100 further includes a CPU (Central Processing Unit) 1107, a clock generator 1108, a RAM (Random Access Memory) 1109, and a sequencer 1110. The microcomputer 1100 is, although not limited in particular, formed on a semiconductor substrate, such as a single crystal silicone substrate, by a well-known semiconductor integrated circuit manufacturing technology.

The ports 1101 and 1104, the timer 1102, the sequencer 1110, the flash memory module 1103, the bus interface 1105, and the clock generator 1108 are coupled with each other via a peripheral bus 1112. The RAM 1109, the flash memory module 1103, the bus interface 1105, the DMAC 1106, and the CPU 1107 are coupled with each other via a high speed bus 1111. The ports 1101 and 1104 transfer various data to and from the exterior. The timer 1102 has a function to detect elapsing of fixed time by counting a clock. The DMAC 1106 controls direct data transfer performed among various devices, bypassing the CPU 1107. The clock generator 1108 includes an oscillator which generates a clock signal of predetermined frequency, and a PLL (Phase Locked Loop) which multiplies the generated clock signal. The microcomputer 1100 is shifted to a standby state when a standby signal STBY is asserted, and initialized when a reset signal RES is asserted. High-potential-side power source Vcc and low-potential-side power source Vss are supplied via predetermined terminals as power supply voltage for operation of the microcomputer 1100. The sequencer 1110 controls sequentially operation of the flash memory module 1103 according to a command from the CPU 1107.

Figure 12:
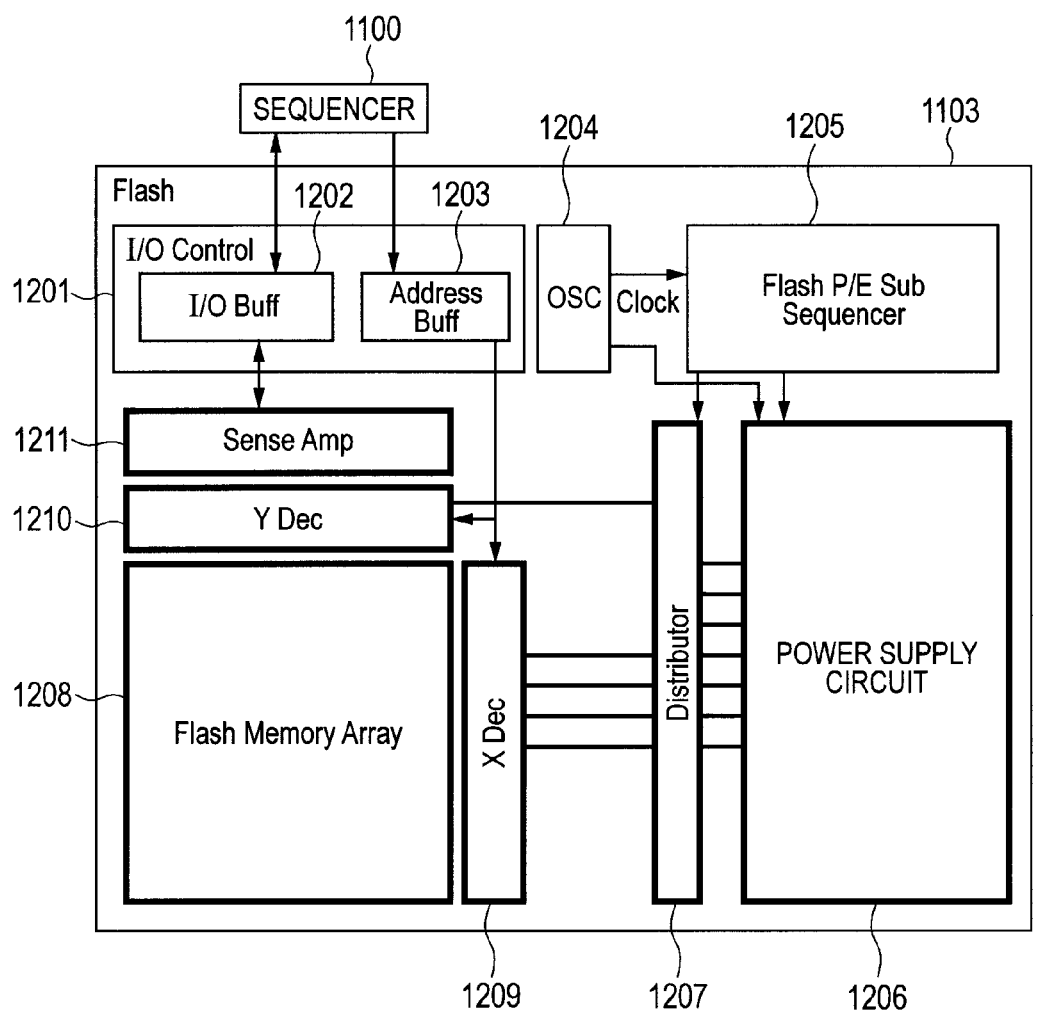
FIG. 12 is a block diagram illustrating an exemplified configuration of a flash memory as an example of a nonvolatile memory according to the present invention.

FIG. 12 illustrates an example of a configuration of the flash memory module 1103.

The flash memory 1103 includes an I/O control circuit 1201, an oscillator (OSC) 1204, a sub sequencer (Sub Sequencer) 1205, a sense amplifier (Sense Amp) 1211, a column decoder (Y Dec) 1210, a flash memory array 1208, and a row decoder (X Dec) 1209. The flash memory 1103 also includes a distributor (Distributor) 1207 and a power supply circuit 1206.

The I/O control circuit (I/O Control) 1201 has a function for controlling signal input-output in the flash memory 1103, and includes an I/O buffer (I/O Buff) 1202 and an address buffer (Address Buff) 1203. The oscillator 1204 generates a clock signal Clock. The generated clock signal Clock is transferred to the sub sequencer 1205 and the power supply circuit 1206. The sub sequencer 1205 controls sequentially operation of the distributor 1207 and the power supply circuit 1206. The power supply circuit 1206 includes plural charge pump circuits for generating mutually different voltages. In the plural charge pump circuits, an operating state/non-operating state is controlled by an on/off control signal from the sub sequencer 1205. Voltage generated by the plural charge pump circuits is transferred to the row decoder 1209 and the column decoder 1210 via the distributor 1207. The row decoder 1209 drives a word line in the flash memory array 1208 to a selection level by decoding a row address transferred via the address buffer 1203. The sense amplifier 1211 obtains readout data by comparing with a reference level a signal selectively outputted from the flash memory array 1208 based on an output of the column decoder 1210. The column decoder 1210 generates a selection signal of a column system by decoding a column address. The flash memory array 1208 is configured by plural flash memory cells arranged in a row direction and a column direction. This nonvolatile memory cell has electrodes of a control gate, a floating gate, a drain, and a source. The drains of the plural flash memory cells arranged in the column direction are joined together, and coupled to a bit line via a sub bit-line selector. The sources of the plural flash memory cells are coupled to a common source line. The flash memory cells coupled to the common source line composes one block, and they are formed in a common well area of the semiconductor substrate, serving as a unit of an erase. On the other hand, the control gates of plural flash memory cells arranged in the row direction are coupled to a word line in units of row.

Figure 13:
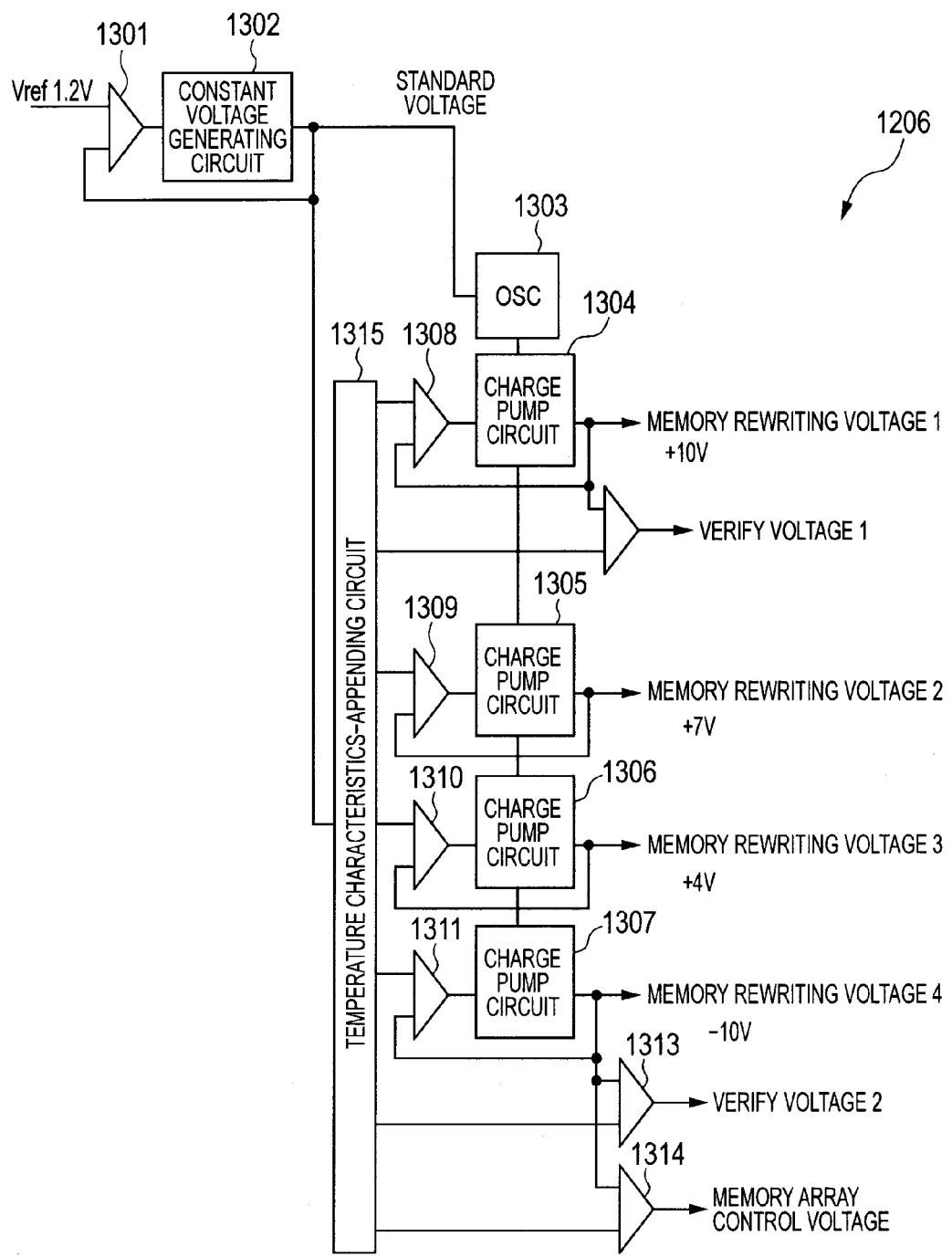
FIG. 13 is a block diagram illustrating an exemplified configuration of a power supply circuit included in the flash memory illustrated in FIG. 12.

FIG. 13 illustrates an example of a configuration of the power supply circuit 1206.

The power supply circuit 1206 includes operational amplifiers 1301, 1312, 1313, and 1314, comparators 1308-1311, a constant voltage generating circuit 1302, an oscillator circuit (OSC) 1303, and charge pump circuits 1304-1307. Based on an output of the operational amplifier 1301, a standard voltage is outputted from the constant voltage generating circuit 1302. The operational amplifier 1301 compares an output voltage of constant voltage generating circuit 1302 with the reference voltage Vref. The reference voltage Vref is set to 1.2V. The oscillator circuit (OSC) 1303 generates a clock signal of a predetermined frequency in response to supply of the standard voltage generated in the constant voltage generating circuit 1302. The clock signal is transferred to the charge pump circuits 1304-1307. A temperature characteristics-appending circuit 1315 appends a predetermined temperature dependence characteristic to the standard voltage generated by the constant voltage generating circuit 1302. The standard voltage to which the temperature dependence characteristic has been appended by the temperature characteristics-appending circuit 1315 is transferred to the comparators 1308-1311.

The comparator 1308 compares an output voltage of the charge pump circuit 1304 with the output of the temperature characteristics-appending circuit 1315. The charge pump circuit 1304 generates a memory rewriting voltage 1 based on the comparison result of the comparator 1308. The memory rewriting voltage 1 is set to +10V. The operational amplifier 1312 adds the output of the temperature characteristics-appending circuit 1315 to the output of the charge pump circuit 1304, to generate a verify voltage 1.

The comparator 1309 compares an output voltage of the charge pump circuit 1305 with the output of the temperature characteristics-appending circuit 1315. The charge pump circuit 1305 generates a memory rewriting voltage 2 based on the comparison result of the comparator 1309. The memory rewriting voltage 2 is set to +7V.

The comparator 1310 compares an output voltage of the charge pump circuit 1306 with the output of the temperature characteristics-appending circuit 1315. The charge pump circuit 1306 generates a memory rewriting voltage 3 based on the comparison result of the comparator 1310. The memory rewriting voltage 3 is set to +4V.

The comparator 1311 compares an output voltage of the charge pump circuit 1307 with the output of the temperature characteristics-appending circuit 1315. The charge pump circuit 1307 generates a memory rewriting voltage 4 based on the comparison result of the comparator 1311. The memory rewriting voltage 4 is set to −10V. The operational amplifier 1313 adds the output of the temperature characteristics-appending circuit 1315 to the output of the charge pump circuit 1307, to generate a verify voltage 2. The operational amplifier 1314 adds the output of the temperature characteristics-appending circuit 1315 to the output of the charge pump circuit 1307, to generate a memory array control voltage.

FIG. 1 illustrates an example of a configuration of the charge pump circuit 1307. Other charge pump circuits 1304-1306 are configured in analogy with the charge pump circuit 1307.

Figure 2:
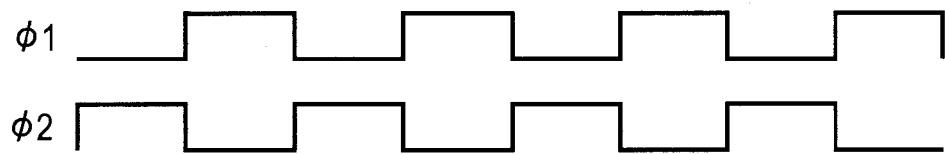
FIG. 2 is a waveform chart illustrating a clock signal supplied to the charge pump circuit illustrated in FIG. 1.

The charge pump circuit 1307 illustrated in FIG. 1 generates a minus high voltage, and includes an n-channel MOS transistor NM0 which stops current supply to the charge pump circuit 1307 when the circuit is at rest, n-channel MOS transistors NM1-NMz (transfer MOS) which transfer a charge, and step-up capacitors C1-Cx. The n-channel MOS transistor NM0 is coupled to the ground (low-potential-side power source Vss). The n-channel MOS transistor NMz is coupled to an output terminal 104. The n-channel MOS transistors NM0-NMz are coupled in series with each other. The step-up capacitors C1-Cx are coupled to drivers DRV1-DRVx for charge and discharge, respectively, and driven by the respective drivers DRV1-DRVx, synchronizing with clock signals $\phi 1$ and $\phi 2$. The other ends of the step-up capacitors C1-Cx are coupled to series coupling nodes of the n-channel MOS transistors NM1-NMz, respectively. The clock signals $\phi 1$ and $\phi 2$ are supplied from the oscillator circuit 1303 illustrated in FIG. 13 and have a different phase by 180 degrees, as illustrated in FIG. 2. Such clock signals $\phi 1$ and $\phi 2$ are supplied to the charge pump circuit 1307, so that the phase is shifted by 180 degrees in the step-up stages in even number and the step-up stages in odd number. The high (H) level of the clock signals $\phi 1$ and $\phi 2$ is equal to the high-potential-side power source voltage Vcc. The low (L) level of the clock signals $\phi 1$ and $\phi 2$ is equal to the low-potential-side power source voltage Vss. AND gates AND1 and AND2 are supplied with a control signal CNT1 transferred from the control circuit 101. An on/off control signal is transferred to the control circuit 101 from the sub sequencer 1205, via an input terminal 102. The control circuit 101 is activated when the on/off control signal is asserted by the sub sequencer 1205. When the control signal CNT1 is set to a high level by the control circuit 101, the clock signals $\phi 1$ and $\phi 2$ are transferred to the drivers DRV1-DRVx via the AND gates AND1 and AND2, respectively. When the control signal CNT1 is set to a low level by the control circuit 101, the clock signals $\phi 1$ and $\phi 2$ are not transferred to the drivers DRV1-DRVx.

A negative voltage Vp is outputted from the output terminal 104. This negative voltage Vp is compared with the standard voltage outputted from the temperature characteristics-appending circuit 1315 in the comparator 1311. The comparison result is transferred to the control circuit 101 via an input terminal 103. In order to stabilize the negative voltage Vp based on the output of the comparator 1311, the control circuit 101 controls supply of the clock signals $\phi 1$ and $\phi 2$ to the drivers DRV1-DRVx, by controlling a logical value of the control signal CNT1.

The voltage level of the output terminal of the charge pump circuit 1304 is stepped up to the negative voltage Vp, by moving a charge alternately by the even number stage and the odd number stage, in synchronization with the clock signals $\phi 1$ and $\phi 2$.

In such a charge pump circuit 1307, an absolute value of voltage becomes larger in a step-up stage which is located nearer the output terminal 104. The voltage applied to the step-up capacitor is given by a difference of Vcc as the high level output of the driver and the step-up voltage Vm. For example, if it is assumed that Vcc=6V and the step-up voltage is −10V, there is a possibility that voltage of 16V may be applied across the terminals of the step-up capacitors C(x−1) and Cx of the step-up stages near the output terminal 104. Therefore, in the present embodiment, the step-up capacitors C(x−1) and Cx are comprised of two capacitors Ca and Cb coupled in series with each other, respectively. Accordingly, it is possible to suppress low the absolute value of voltage applied to per capacitor.

Diodes D1 and D2 are provided as a device for making a suitable leakage path from series coupling nodes (intermediate nodes) 105 and 106, in the case of forming one step-up capacitor from two capacitors coupled in series with each other. These diodes D1 and D2 are pn junction diodes. The anode of the diode D1 is coupled to the series coupling node 105 of capacitors Ca and Cb of the step-up capacitor C(x−1), and the anode of the diode D2 is coupled to the series coupling node 106 of capacitors Ca and Cb of the step-up capacitor Cx. The cathodes of the diodes D1 and D2 are coupled to the control circuit 101 in common. The control circuit 101 sets the cathodes of the diodes D1 and D2 to the ground level (level of the low-potential-side power source Vss), in a non-operating state (off state) of the charge pump circuit 1307. The control circuit 101 sets the cathodes of the diodes D1 and D2 to the level of the high-potential-side power source Vcc, in an operating state (on state) of the charge pump circuit 1307. Such control will be explained later in full detail.

The step-up capacitors C(x−1) and Cx can be formed as follows.

Figure 3A:
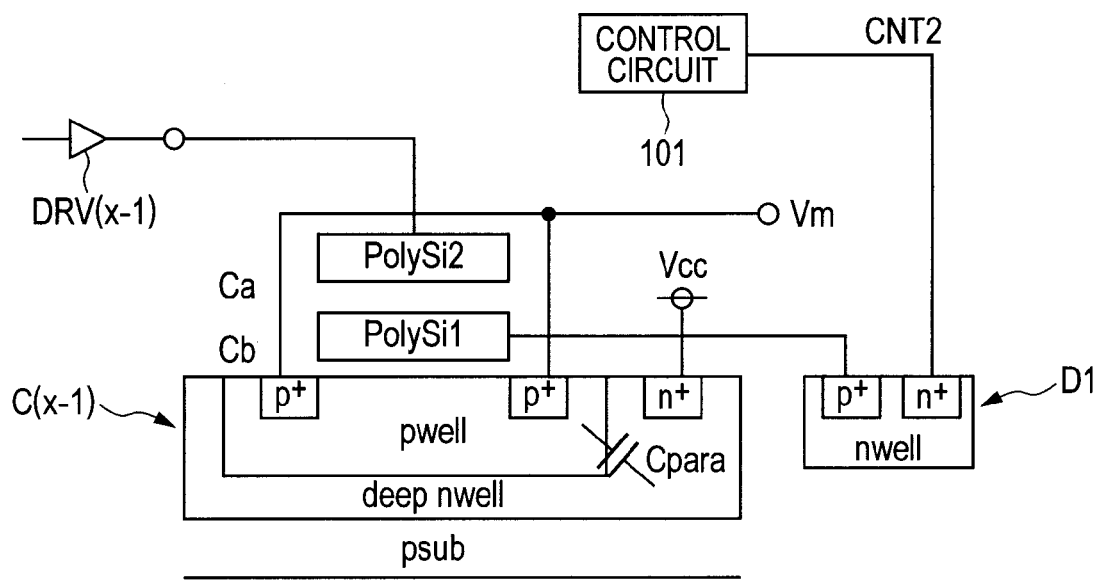
FIG. 3(A) and FIG. 3(B) are explanatory diagrams illustrating an exemplified configuration of a step-up capacitor in the charge pump circuit illustrated in FIG. 1.

FIG. 3(A) illustrates an exemplified configuration of the step-up capacitor C(x−1). The step-up capacitor Cx can be formed similarly.

The step-up capacitor C(x−1) illustrated in FIG. 3(A) is realized as a laminated capacitor formed by lamination of two polysilicon layers with an interposing insulating film over a well region. A well region deep nwell is formed in a p-type substrate psub, a well region pwell is formed in the well region deep nwell, and a diffusion layer p+ is formed in the well region pwell. Over this surface, a first polysilicon layer PolySi1 and a second polysilicon layer PolySi2 are laminated, with an interposing insulating film. A silicon nitride is used as the insulating film interposed between the first polysilicon layer PolySi1 and the second polysilicon layer PolySi2, and a silicon oxide or others are used as the insulating film interposed between the first polysilicon layer PolySi1 and the well region pwell. The capacitor Ca is formed by placing the first polysilicon layer PolySi1 and the second polysilicon layer PolySi2 face to face with an insulating film interposed therebetween. The capacitor Cb is formed by placing the first polysilicon layer PolySi1 in face of the well region pwell with an insulating film interposed therebetween. The step-up capacitor C(x−1) is formed by series coupling of the capacitor Ca and capacitor Cb. The output of the capacitance driver DRV(x−1) is transferred to the second polysilicon layer PolySi2. A step-up voltage Vm is obtained from a diffusion layer p+ in the well region pwell. A diffusion layer n+ is formed in the well region deep nwell, and the high-potential-side power source Vcc is transferred to the diffusion layer n+. The diode D1 is realized by a pn junction diode formed by diffusion layers p+ and n+ which are formed in a well region nwell formed in the p-type substrate psub.

A flash memory cell is comprised of a floating gate and a control gate laminated respectively on a well region. The step-up capacitor C(x−1) is formed by the same process as the present flash memory cell.

Figure 3B:
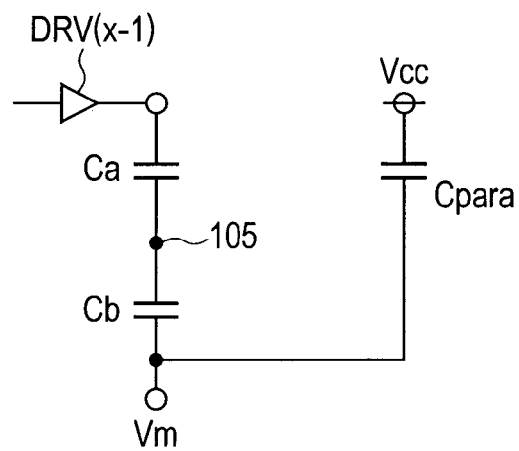

FIG. 3(B) illustrates an equivalent circuit of the principal part in FIG. 3(A) and the intermediate node 105.

In the case of the laminated capacitor illustrated in FIG. 3(A), since the capacitors Ca and Cb are stacked in tandem and furthermore they are coupled in series as stacked in tandem, parasitic capacitance produced at the series coupling node (intermediate node) 105 of the two capacitors coupled in series to form one step-up capacitor is negligibly small. Assuming that parasitic capacitance between a terminal of the high-potential-side power source Vcc and a terminal of the step-up voltage Vm is Cpara, the amplitude of the step-up voltage Vm is given by the following equation.

Amplitude_of_$Vm=(Vcc \cdot Ca \cdot Cb)/(Ca \cdot (Cb+Cpara))$ (Equation 1)

When it is assumed that Ca=Cb and that the parasitic capacitance Cpara is 20% of the capacitance of the capacitor Cb, the amplitude of the step-up voltage Vm becomes 83% of Vcc, as derived by the following equation.

Amplitude_of_$Vm=Vcc \times 1/1.2=Vcc \times 83\%$ (Equation 2)

In the case of the laminated capacitor illustrated in FIG. 3(A), it is expected that the voltage applied to the intermediate node 105 is one half of the voltage applied to the step-up capacitor C(x−1). Here, if it is assumed that the intermediate node 105 is in a floating state, the intermediate node 105 may be charged up and the voltage applied to the intermediate node 105 becomes unknown in value.

Figure 6:
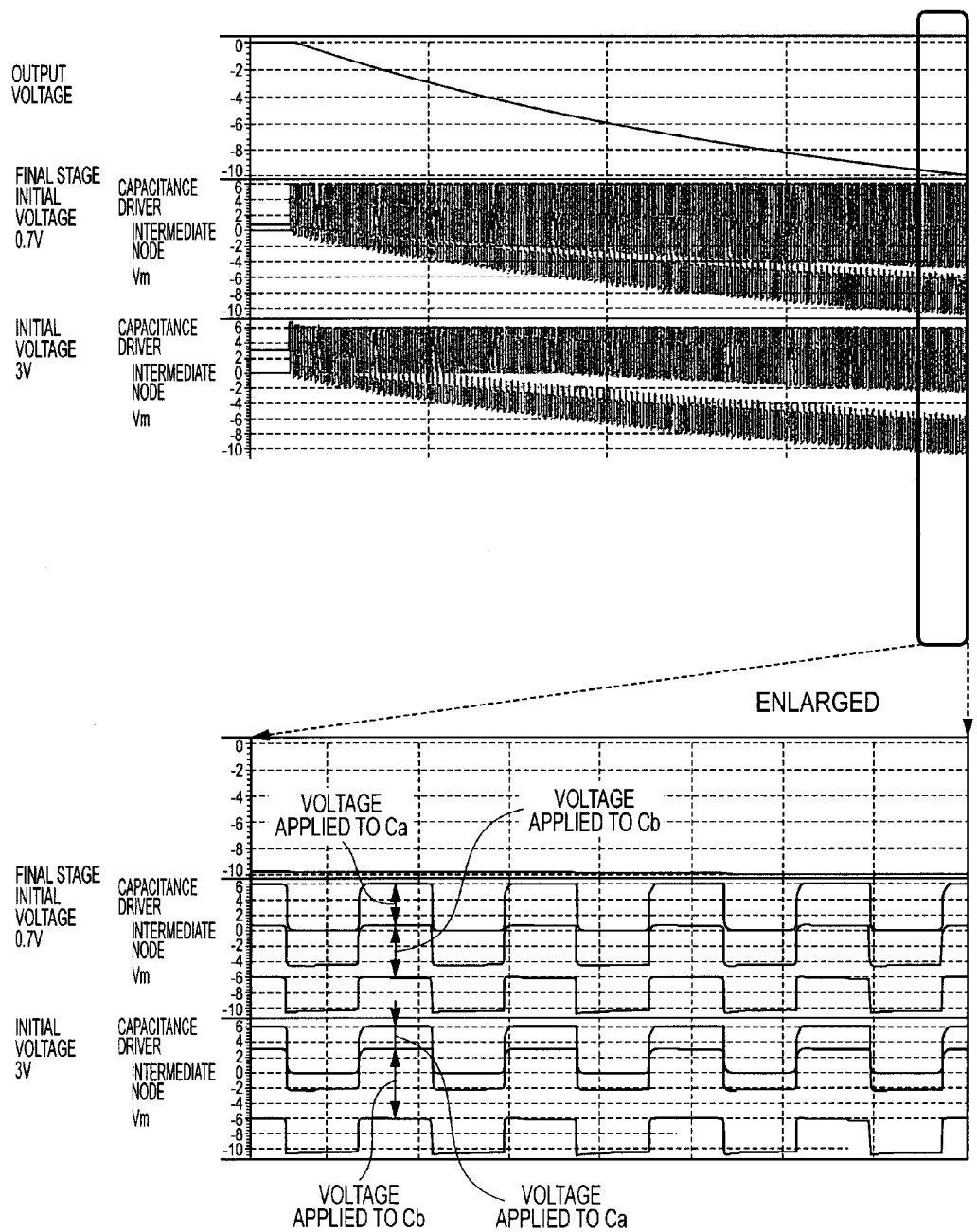
FIG. 6 is an explanatory diagram illustrating a simulation result obtained on the assumption that an intermediate node is in a floating state in the charge pump circuit illustrated in FIG. 1.

FIG. 6 illustrates a simulation result in cases where it is assumed that the intermediate node 105 is in a floating state and that the initial voltage of the intermediate node 105 concerned is 0.7V and 3V. In the case of 3V, the voltage applied to the intermediate node 105 shifts greatly from one half of the voltage applied to the step-up capacitor C(x−1), and deviation of the voltage is produced. Depending on a charged voltage, there is a possibility that an excessive voltage is applied to either of the capacitors Ca and Cb, exceeding the destruction withstand voltage of the capacitor.

On the other hand, according to the configuration illustrated in FIG. 1, the diodes D1 and D2 are provided as a device for forming a leakage path from the intermediate nodes 105 and 106, and the diodes D1 and D2 are controlled by the control circuit 101. Accordingly, device destruction resulting from electrification of the intermediate node is avoided, and reduction of the pump efficiency resulting from the leakage current which flows through the leakage path from the intermediate nodes 105 and 106 is also avoided.

Figure 7:
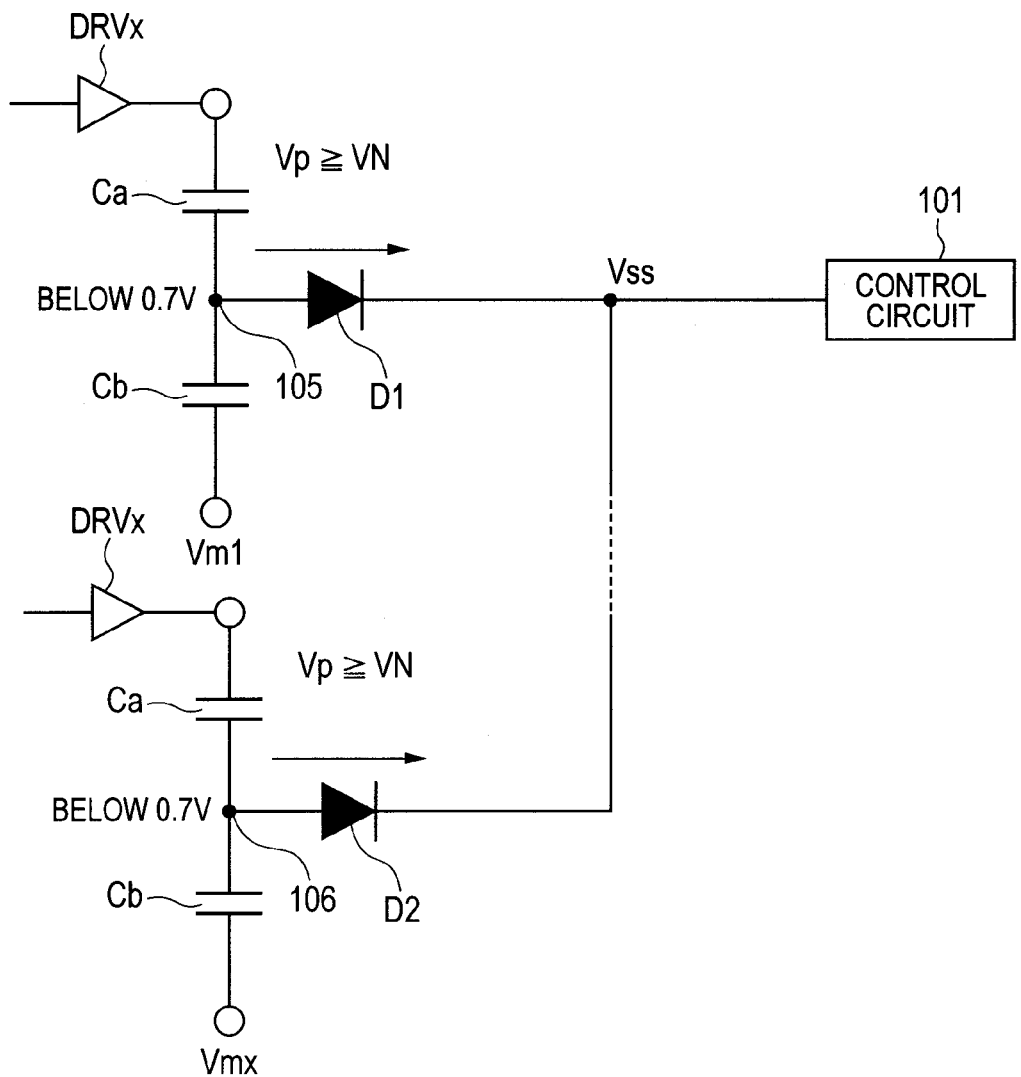
FIG. 7 is an explanatory diagram illustrating anon-operating state (off state) of the charge pump circuit illustrated in FIG. 1.
Figure 8:
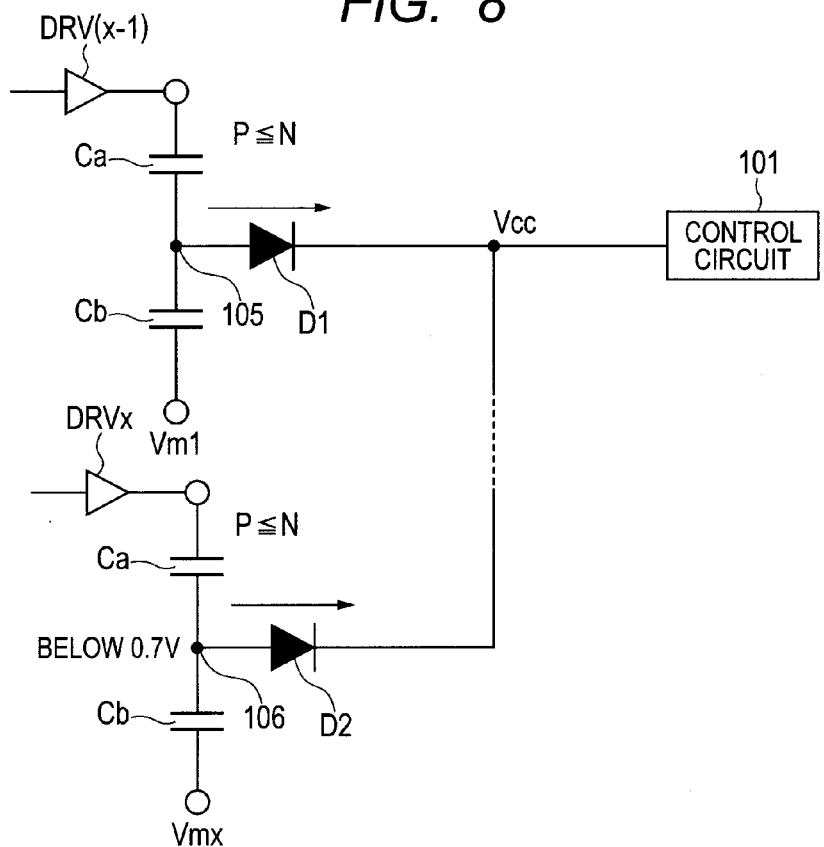
FIG. 8 is an explanatory diagram illustrating an operating state (on state) of the charge pump circuit illustrated in FIG. 1.
Figure 9:
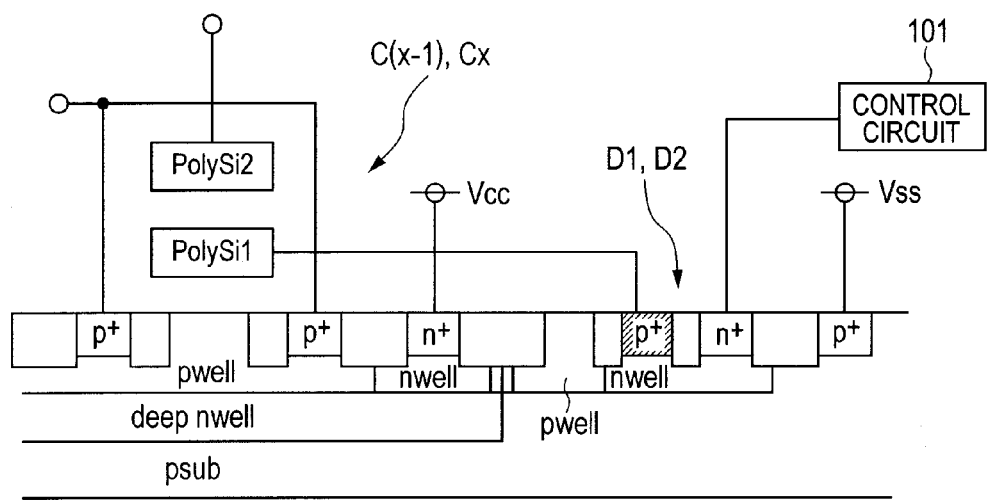
FIG. 9 is an explanatory diagram illustrating an exemplified configuration of a diode coupled to a series coupling node of two capacitances.

In a non-operating state (off state) of the charge pump circuit 1307, as illustrated in FIG. 7, the cathodes of the diodes D1 and D2 are set to the ground level (the level of the low-potential-side power source Vss) by the control circuit 101, thereby the diodes D1 and D2 are set to a conduction state (on state). Accordingly a charge of the intermediate nodes 105 and 106 flows to the control circuit 101 via the diodes D1 and D2. Therefore, the potential of the intermediate nodes 105 and 106 becomes below a forward voltage (0.7V) of the diodes D1 and D2. Therefore, it is possible to avoid device destruction resulting from electrification of the intermediate node. In an operating state (on state) of the charge pump circuit 1307, as illustrated in FIG. 8, the cathodes of the diodes D1 and D2 are set to the level of the high-potential-side power source Vcc by the control circuit 101, thereby the diodes D1 and D2 are set to a non-conduction state (off state). Since the amplitude of drive voltage in the capacitance drivers DRV(x−1) and DRVx is within the range from Vss to Vcc, the potential of the intermediate nodes 105 and 106 does not become higher than Vcc. Therefore, the diodes D1 and D2 are always reverse-biased, and a forward current will not be generated. Accordingly, it is possible to avoid reduction of the pump efficiency resulting from the leakage current which flows through the leakage path from the intermediate nodes 105 and 106. As the result of providing the diodes D1 and D2, junction capacitance and wiring capacitance are added as parasitic capacitance. However, it is sufficient for the diodes D1 and D2 to have a minimum size allowable on the layout rule, and the wiring capacitance can be also minimized, by arranging the diodes D1 and D2 near the respectively corresponding step-up capacitors C(x+1) and Cx, as illustrated in FIG. 9. Since the diodes D1 and D2 are a pn junction diode formed by use of diffusion layers p+ and n+ in the well region nwell, it is possible to suppress the pn junction capacity small.

In the above, the charge pump circuit which outputs a negative voltage has been explained. A charge pump circuit which outputs a positive voltage can be configured in the same manner. In the charge pump circuit which outputs a positive voltage, n-channel type MOS transistors NM0-NMz illustrated in FIG. 1 are replaced with p-channel MOS transistors, and the high-potential-side power source Vcc is coupled to a p-channel MOS transistor (corresponding to NM0) for the switch which stops current supply at the time of stoppage.

Embodiment 2

Figures 4A, 4B:
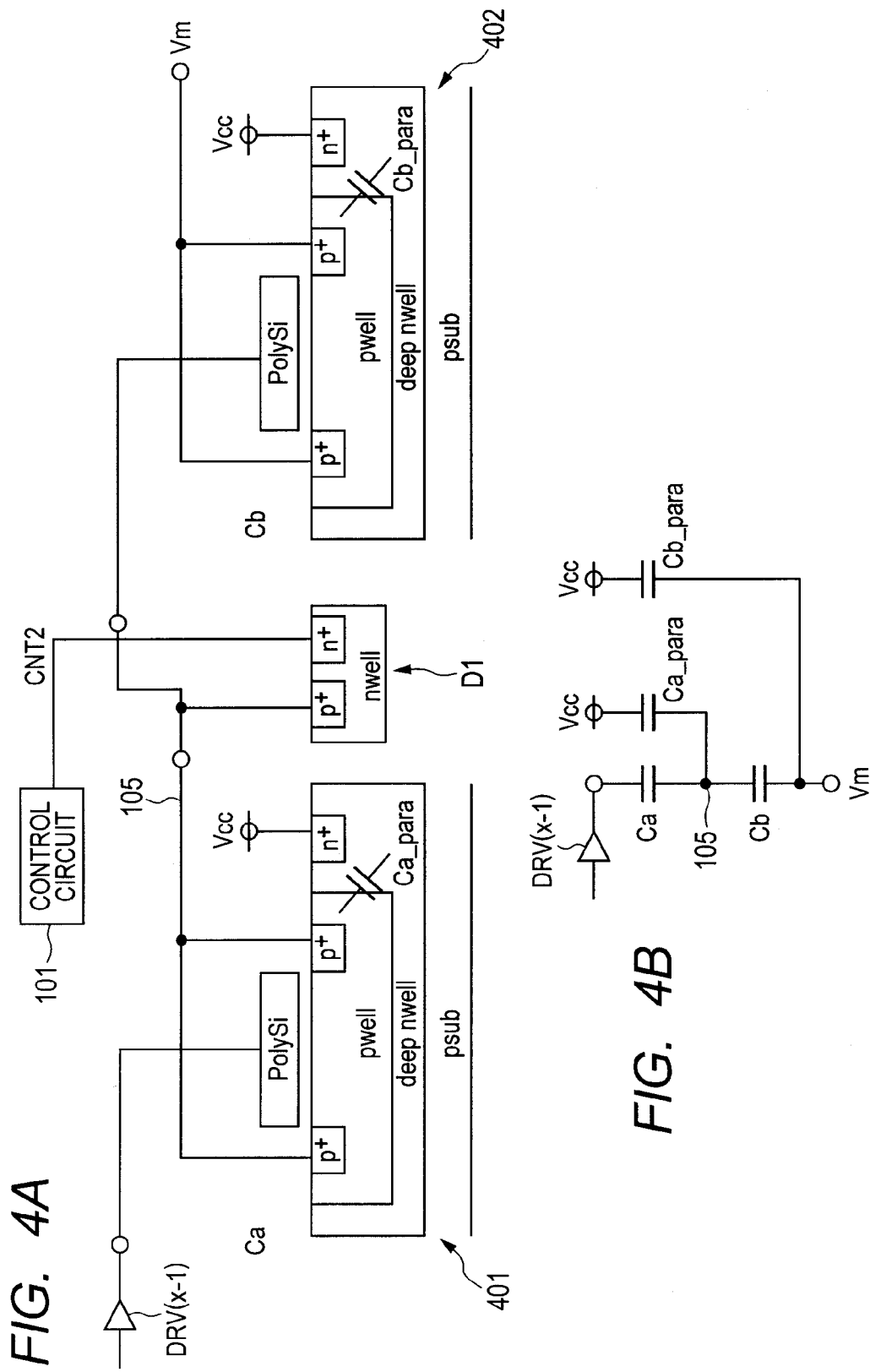
FIG. 4(A) and FIG. 4(B) are explanatory diagrams illustrating another exemplified configuration of a step-up capacitor in the charge pump circuit illustrated in FIG. 1.

It is possible to apply a monolayer capacitor as illustrated in FIG. 4(A) as the step-up capacitors C(x−1) and Cx illustrated in FIG. 1.

The capacitors Ca and Cb are a monolayer capacitor, respectively, and are formed in mutually different capacity forming regions 401 and 402.

In the capacity forming region 401, a well region deep nwell is formed in a p-type substrate psub, a well region pwell is formed in the well region deep nwell, and a diffusion layer p+ is formed in the well region pwell. Over this surface, a polysilicon layer PolySi is laminated with an interposing insulating film. The capacitor Ca is formed in the capacity forming region 401, by placing the polysilicon layer PolySi in face of the well region pwell with an insulating film interposed therebetween.

In the capacity forming region 402, a well region deep nwell is formed in a p-type substrate psub, a well region pwell is formed in the well region deep nwell, and a diffusion layer p+ is formed in the well region pwell. Over this surface, a polysilicon layer PolySi is laminated with an interposing insulating film. The capacitor Cb is formed in the capacity forming region 402, by placing the polysilicon layer PolySi in face of the well region pwell with an insulating film interposed therebetween.

The output of the capacitance driver DRV(x−1) is transferred to the polysilicon layer PolySi in the capacity forming region 401. The diffusion layer p+ in the capacity forming region 401 and the polysilicon layer PolySi in the capacity forming region 402 are coupled, and the intermediate node 105 is formed. The present intermediate node 105 is coupled to the control circuit 101 via the diode D1 as is the case with Embodiment 1. The step-up voltage Vm is obtained from the diffusion layer p+ in the capacity forming region 402.

FIG. 4(B) illustrates an equivalent circuit of the principal part in FIG. 4(A).

The capacitors Ca and Cb are coupled in series with each other. Assuming that parasitic capacitance between the high-potential-side power source Vcc and the intermediate node 105 is Ca_para and that parasitic capacitance between a terminal of the high-potential-side power source Vcc and a terminal of the step-up voltage Vm is Cb_para, the amplitude of the step-up voltage Vm is given by the following equation.

Amplitude_of_$Vm = (Vcc \cdot Ca \cdot Cb)/((Ca+Ca\_para) \cdot (Cb+Cb\_para))$      (Equation 3)

When it is assumed that Ca=Cb and that the parasitic capacitance Ca_para is 20% of the capacitance of the capacitor Ca and the parasitic capacitance Cb_para is 20% of the capacitance of the capacitor Cb, the amplitude of the step-up voltage Vm becomes 70% of Vcc, as derived by the following equation.

Amplitude_of_$Vm = Vcc \times 1/1.44 = Vcc \times 70\%$

Since the amplitude of Vm in the case of Embodiment 1 is 83% of Vcc as derived by Equation 2, compared with that, the amplitude of Vm in the case of Embodiment 2 is reduced. In the charge pump circuit which uses the capacitor illustrated in FIG. 3(A), stepping up from Vcc=1.62 to −10V requires eight step-up stages in the charge pump circuit. On the other hand, in the charge pump circuit which uses the capacitor illustrated in FIG. 4(A), stepping up from Vcc=1.62 to −10V requires nine step-up stages in the charge pump circuit; accordingly, the number of step-up stages increases.

However, also in the case where a monolayer capacitor (Ca, Cb) as illustrated in FIG. 4(A) is applied as the step-up capacitors C(x−1) and Cx as illustrated in FIG. 1, it is possible to suppress low the absolute value of voltage applied to per capacitor, owing to series coupling of the two monolayer capacitors (Ca, Cb). Since the intermediate node 105 is not floating in the configuration illustrated in FIG. 4, it is thinkable that a charge electrified in the intermediate node 105 is discharged by junction leakage through the well region as time elapses. However, if a charge electrified in the intermediate node 105 is not fully discharged, an excessive voltage will be applied to either of the capacitors Ca and Cb, depending on the charged voltage, as is the case with the configuration illustrated in FIG. 3(A). Accordingly, there is a possibility that the excessive voltage exceeds the destruction withstand voltage of the capacitor.

Therefore, also in the charge pump circuit which uses the capacitor illustrated in FIG. 4(A), by providing diodes D1 and D2 to the intermediate nodes 105 and 106, and controlling the diodes D1 and D2 by the control circuit 101, as is the case illustrated in FIG. 1, it is possible to avoid device destruction resulting from electrification of the intermediate node, and furthermore, it is possible to avoid reduction of the pump efficiency resulting from the leakage current which flows through the leakage path from the intermediate nodes 105 and 106.

Embodiment 3

Figure 5A:
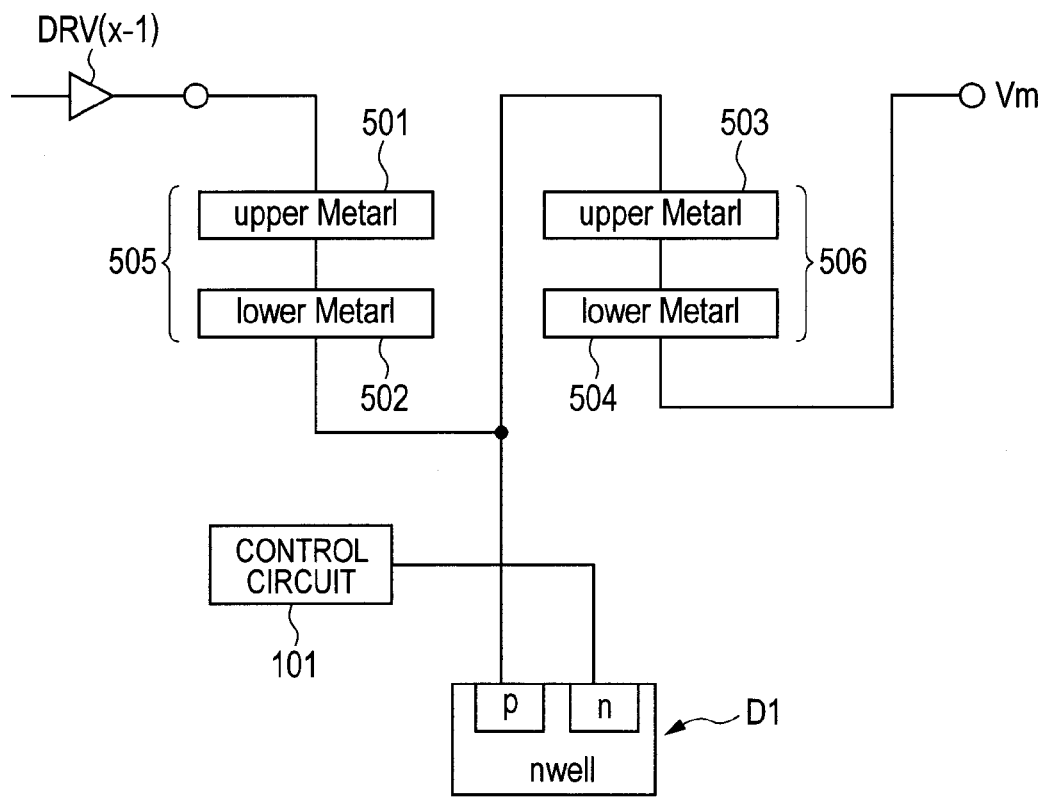
FIG. 5(A) and FIG. 5(B) are explanatory diagrams illustrating yet another exemplified configuration of a step-up capacitor in the charge pump circuit illustrated in FIG. 1.

In a semiconductor integrated circuit, it is possible to form a capacitor by use of laminated structure of metal-insulator-metal (the capacitor is called henceforth a Metal-Insulator-Metal capacitor (MIM capacitor)). Therefore, it is also preferable to apply an MIM capacitor as illustrated in FIG. 5(A) as the step-up capacitors C(x−1) and Cx illustrated in FIG. 1. For example, in FIG. 5(A), an MIM capacitor 505 is formed by lamination of an upper metal layer 501 and a lower metal layer 502 with an interposing insulating film, and an MIM capacitor 506 is formed by lamination of an upper metal layer 503 and a lower metal layer 504 with an interposing insulating film. The MIM capacitors 505 and 506 correspond to the capacitors Ca and Cb illustrated in FIG. 1.

Figure 5B:
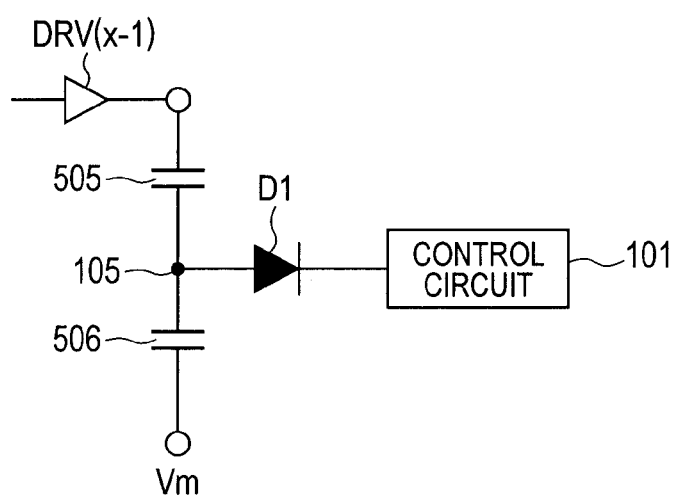

FIG. 5(B) illustrates an equivalent circuit of the principal part in FIG. 5(A).

Also when the MIM capacitors 505 and 506 are used, by providing diodes D1 and D2 to the intermediate nodes 105 and 106, and controlling the diodes D1 and D2 by the control circuit 101, as is the case illustrated in FIG. 1, it is possible to avoid device destruction resulting from electrification of the intermediate node, and furthermore, it is possible to avoid reduction of the pump efficiency resulting from the leakage current which flows through the leakage path from the intermediate nodes 105 and 106.

Embodiment 4

Figure 10:
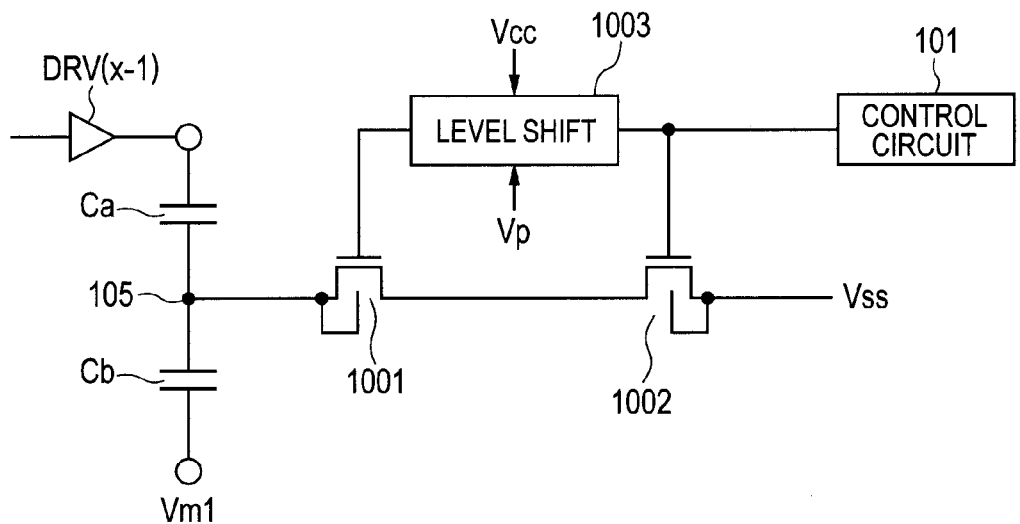
FIG. 10 an explanatory diagram illustrating the case where a switch by means of an n-channel MOS transistor is used in place of the diode illustrated in FIG. 9.

In place of the diodes D1 and D2 illustrated in FIG. 1, it is possible to apply a switch by means of an n-channel MOS transistor, as illustrated in FIG. 10.

In FIG. 10, n-channel MOS transistors 1001 and 1002 are provided. The n-channel MOS transistor 1001 is coupled to the intermediate node 105, and the n-channel MOS transistor 1002 is coupled to the low-potential-side power source Vss. The n-channel MOS transistors 1001 and 1002 are coupled in series with each other. The output of the control circuit 101 is transferred to a gate of the n-channel MOS transistor 1002. The output of the control circuit 101 is level-shifted in a level shift circuit 1003, and transferred to a gate of the n-channel MOS transistor 1001. The high-potential-side power source Vcc and the output Vp of the charge pump circuit 1307 is transferred to the level shift circuit 1003. When the output of the control circuit 101 is at a high level, gates of the n-channel MOS transistors 1001 and 1002 are set to the level of the high-potential-side power source Vcc. When the output of the control circuit 101 is at a low level, the gate of the n-channel MOS transistor 1002 is set to the level of the low-potential-side power source Vss. However, the gate of the n-channel MOS transistor 1001 is set to the level of the output Vp of the charge pump circuit 1307. Accordingly, the n-channel MOS transistor 1001 can be turned off certainly, irrespective of the potential of the intermediate node 105.

As described above, even when the switch by means of the n-channel MOS transistors 10.01 and 1002 is applied in place of the diodes D1 and D2 illustrated in FIG. 1, the same working-effect as is the case with Embodiment 1 can be obtained, by performing an on-off control of the n-channel MOS transistors 1001 and 1002 based on the output of the control circuit 101.

Embodiment 5

It is possible to apply the microcomputer 1100 according to Embodiment 1-Embodiment 4 to various microcomputer application systems.

Figure 14:
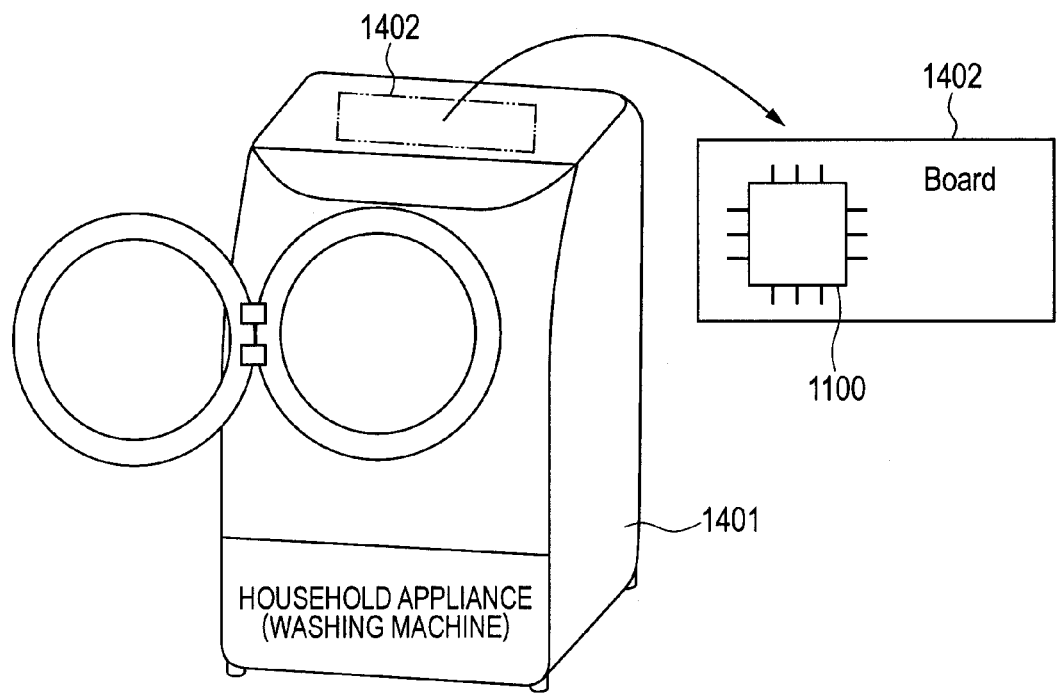
FIG. 14 is an explanatory diagram illustrating a system adapting the microcomputer illustrated in FIG. 11.

The microcomputer 1100 according to Embodiment 1-Embodiment 4 can be applied to a control board 1402 of a washing machine 1401 as an example of home electric appliances, as illustrated in FIG. 14, for example. The control board 1402 mounts the microcomputer 1100 which executes a predetermined control program and performs control etc. of an inverter motor mounted in the washing machine 1401.

Figure 15:
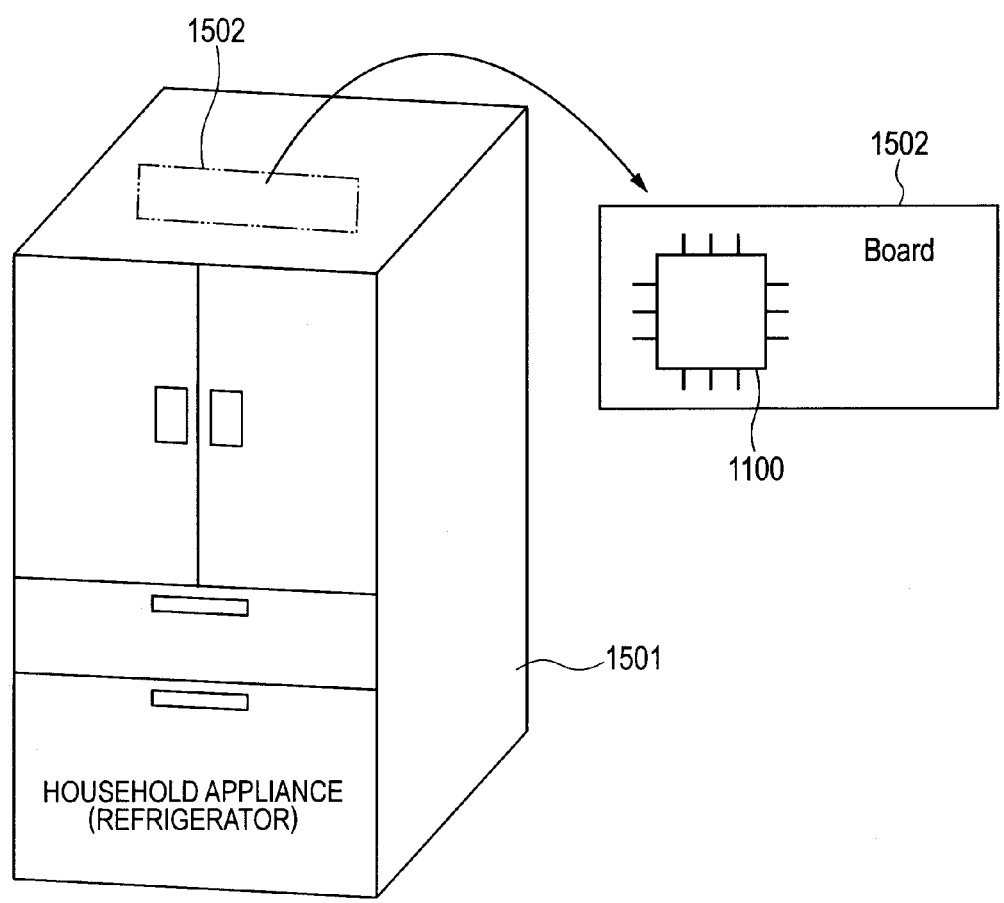
FIG. 15 is an explanatory diagram illustrating another system adapting the microcomputer illustrated in FIG. 11.

The microcomputer 1100 according to Embodiment 1-Embodiment 4 can be also applied to a control board 1502 of a refrigerator 1501 as an example of home electric appliances, as illustrated in FIG. 15, for example. The control board 1502 mounts the microcomputer 1100 which executes a predetermined control program, and performs compressor inverter control, fan control, ice making control, display control, etc.

Figure 16:
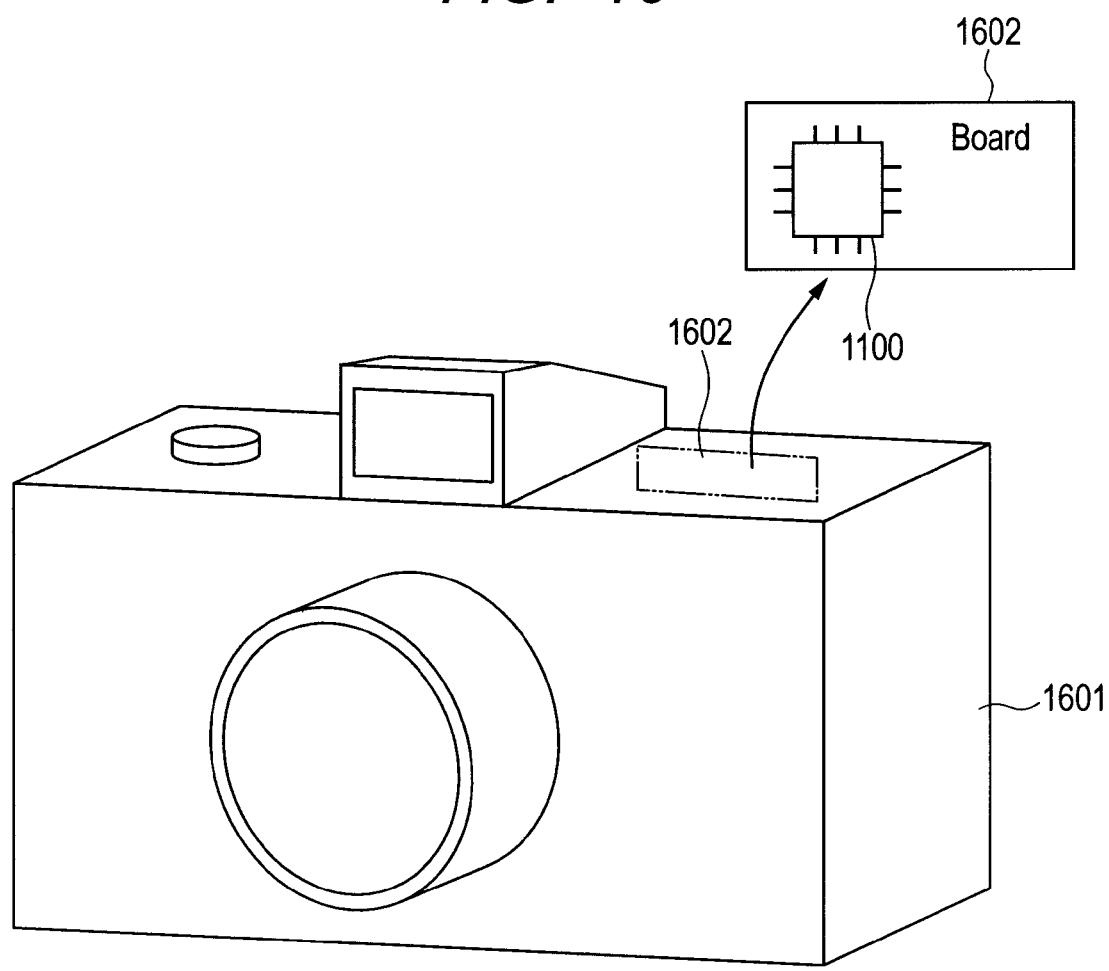
FIG. 16 is an explanatory diagram illustrating yet another system adapting the microcomputer illustrated in FIG. 11.

The microcomputer 1100 according to Embodiment 1-Embodiment 4 can be further applied to a control board 1602 of a digital camera 1601 as an example of home electric appliances, as illustrated in FIG. 16, for example. The control board 1602 mounts the microcomputer 1100 which executes a predetermined control program and performs operation control etc. of an image pickup unit, an image processor, and a sequencer unit of the digital camera 1601.

As described above, the invention accomplished by the present inventors has been concretely explained based on various embodiments. However, it cannot be overemphasized that the present invention is not restricted to the embodiments, and it can be changed variously in the range which does not deviate from the gist.

What is claimed is:

1. A charge pump circuit comprising:
   a step-up capacitor comprising a first capacitance and a second capacitance coupled in series with each other;
   a capacitance driver operable to generate a step-up voltage by driving the step-up capacitor; and
   a protection circuit coupled to a series coupling node of the first capacitance and the second capacitance,
   wherein, when the step-up voltage is not generated, the protection circuit is set in a conductive state and discharges a stored charge at the series coupling node of the first capacitance and the second capacitance, and when the step-up voltage is generated, the protection circuit is maintained in a non-conductive state,
   wherein the protection circuit comprises a diode coupled to the series coupling node of the first capacitance and the second capacitance,
   wherein the charge pump circuit further comprises a control circuit operable to control potential of a cathode of the diode, and
   wherein, when the step-up voltage is not generated, the control circuit controls the cathode of the diode to a low level, and when the step-up voltage is generated, the control circuit controls the cathode of the diode to a high level.

2. The charge pump circuit according to claim 1,
   wherein the diode is a pn junction diode in which a p-type diffusion layer and an n-type diffusion layer in an n-well region are joined, and an anode of the pn junction diode is coupled to the series coupling node of the first capacitance and the second capacitance.

3. The charge pump circuit according to claim 1,
   wherein the protection circuit comprises a switch by means of an MOS transistor coupled to the series coupling node of the first capacitance and the second capacitance.

4. The charge pump circuit according to claim 3, further comprising:
   a control circuit operable to control operation of the switch by means of the MOS transistor.

5. The charge pump circuit according to claim 4,
   wherein, when the step-up voltage is not generated, the control circuit controls the switch to a conductive state, and when the step-up voltage is generated, the control circuit controls the switch to a non-conductive state.

6. The charge pump circuit according to claim 2,
   wherein the step-up capacitor comprising the first capacitance and the second capacitance coupled in series with each other is formed with lamination of a first polysilicon layer and a second polysilicon layer, with an insulating film interposed therebetween, over the well region.

7. The charge pump circuit according to claim 2,
   wherein the first capacitance and the second capacitance are a monolayer capacitor comprised of lamination of a polysilicon layer with an interposing insulating film over the well region.

8. The charge pump circuit according to claim 2,
   wherein the first capacitance and the second capacitance are an MIM capacitor comprised of lamination of an upper metal layer and a lower metal layer with an insulating film interposed therebetween.

9. A nonvolatile memory comprising:
   a charge pump circuit according to claim 2;
   a memory array in which nonvolatile memory cells are arranged; and
   a circuit operable to performs a read/write to the memory array using a step-up voltage generated by the charge pump circuit.

10. A data processing apparatus comprising:
    a nonvolatile memory according to claim 9; and
    a CPU operable to access the nonvolatile memory.

11. A microcomputer application system comprising:
    a microcomputer operable to execute a predetermined control program,
    wherein the microcomputer comprises the data processing apparatus according to claim 10.

* * * * *